United States Patent
Huang

(10) Patent No.: US 12,426,235 B2
(45) Date of Patent: Sep. 23, 2025

(54) SEMICONDUCTOR STRUCTURE AND METHOD FOR FABRICATING THE SAME

(71) Applicant: CHANGXIN MEMORY TECHNOLOGIES, INC., Hefei (CN)

(72) Inventor: Meng Huang, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 475 days.

(21) Appl. No.: 17/952,294

(22) Filed: Sep. 25, 2022

(65) Prior Publication Data

US 2023/0013215 A1  Jan. 19, 2023

(30) Foreign Application Priority Data

Jun. 29, 2022 (CN) .......................... 202210753422.0

(51) Int. Cl.
- H10B 12/00 (2023.01)
- H01L 21/306 (2006.01)
- H01L 21/762 (2006.01)

(52) U.S. Cl.
CPC ... *H10B 12/0387* (2023.02); *H01L 21/30604* (2013.01); *H01L 21/76232* (2013.01); *H10B 12/482* (2023.02)

(58) Field of Classification Search
CPC .............. H10B 12/0387; H10B 12/482; H01L 21/30604; H01L 21/76232
See application file for complete search history.

(56) References Cited

U.S. PATENT DOCUMENTS

| | | | |
|---|---|---|---|
| 5,658,816 A * | 8/1997 | Rajeevakumar | H10B 12/038 257/E21.651 |
| 10,424,487 B2 | 9/2019 | Ko et al. | |
| 2007/0215975 A1* | 9/2007 | Idani | H01L 21/76205 257/E21.546 |
| 2019/0157156 A1* | 5/2019 | Chen | H01L 21/02274 |
| 2022/0352191 A1* | 11/2022 | Sun | H10D 84/038 |

* cited by examiner

*Primary Examiner* — Richard A Booth
(74) *Attorney, Agent, or Firm* — Kilpatrick Townsend & Stockton LLP

(57) ABSTRACT

Embodiments relate to a semiconductor structure and a method for fabricating the same. The method includes: providing a substrate, where a plurality of first trench initial structures are formed on the substrate, and the first trench initial structures extend along a first direction; and sequentially performing a thermal oxidation process and an oxide etching process on trench walls of the first trench initial structures to form first trenches whose trench widths satisfy a first preset dimension. The semiconductor structure and the method for fabricating the same can precisely control a trench width dimension of a trench, to form an isolation structure having a precise dimension in the trench, thereby effectively reducing parasitic capacitance and improving production yield and electrical properties of the semiconductor structure.

12 Claims, 4 Drawing Sheets

SEMICONDUCTOR STRUCTURE AND METHOD FOR FABRICATING THE SAME

CROSS-REFERENCE TO RELATED APPLICATION

This application claims priority to Chinese Patent Application No. 202210753422.0, titled "SEMICONDUCTOR STRUCTURE AND METHOD FOR FABRICATING THE SAME" and filed to the State Patent Intellectual Property Office on Jun. 29, 2022, the entire contents of which are incorporated herein by reference.

TECHNICAL FIELD

The present disclosure relates to the field of semiconductor technology, and more particularly, to a semiconductor structure and a method for fabricating the same.

BACKGROUND

As a semiconductor memory commonly used in an electronic device such as a computer, a dynamic random access memory (DRAM) includes a plurality of memory cells. Each of the memory cells generally includes a transistor and a capacitor. A gate of the transistor is electrically connected to a word line, a source of the transistor is electrically connected to a bit line, and a drain of the transistor is electrically connected to the capacitor. A word line voltage of the word line can control on or off of the transistor, such that data information stored in the capacitor can be read through the bit line, or the data information can be written into the capacitor.

However, with the development of semiconductor technologies, feature dimensions of devices in integrated circuits are getting smaller and smaller. Especially after a semiconductor process enters a deep sub-micron stage, vertical transistor arrays are arranged in the DRAM, and use of buried bit lines and buried word lines (that is, arranged inside a substrate) can simplify connection structures between transistor arrays and capacitors. For example, part of contact structures can be eliminated. However, the use of the buried bit lines is also prone to a larger parasitic capacitance.

Therefore, how to effectively reduce the parasitic capacitance between the buried bit lines has also become an urgent problem to be solved in the related art.

SUMMARY

On this basis, embodiments of the present disclosure provide a semiconductor structure and a method for fabricating the same.

In one aspect, some embodiments of the present disclosure provide a method for fabricating a semiconductor structure. The method for fabricating the semiconductor structure includes: providing a substrate, where a plurality of first trench initial structures are formed on the substrate, and the plurality of first trench initial structures extend along a first direction; and sequentially performing a thermal oxidation process and an oxide etching process on trench walls of the plurality of first trench initial structures to form a plurality of first trenches whose trench widths satisfy a first preset dimension.

In another aspect, some embodiments of the present disclosure provide a semiconductor structure, which is obtained by means of the method for fabricating the semiconductor structure as described in some of the above embodiments.

BRIEF DESCRIPTION OF THE DRAWINGS

To describe the technical solutions in the embodiments of the present disclosure or the existing technologies more clearly, the accompanying drawings required for describing the embodiments or the existing technologies will be briefly introduced below. Apparently, the accompanying drawings in the following description are merely some embodiments of the present disclosure. To those of ordinary skills in the art, other accompanying drawings may also be derived from these accompanying drawings without creative efforts.

REFERENCE NUMBERS IN THE ATTACHED DRAWINGS

Figure 1:
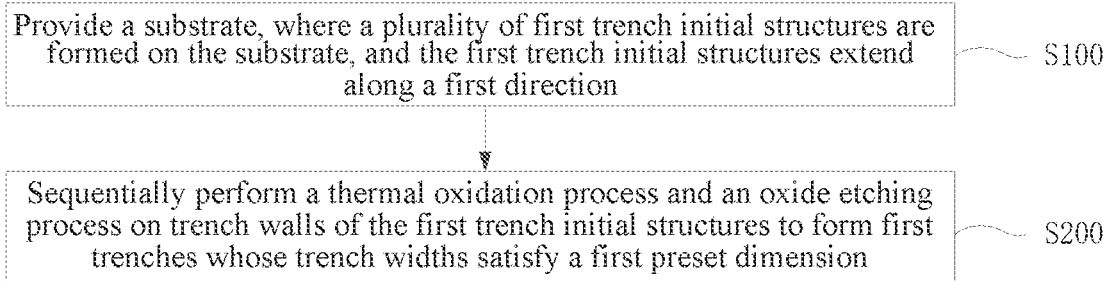
FIG. 1 is a flowchart of a method for fabricating a semiconductor structure provided in an embodiment.

1—substrate, 10—active area, 11—etching protection layer, R1—cell array region, R2—peripheral circuit region, BL—bit line, WL—word line;
Y1—hard mask layer, Y2—anti-reflection layer, 2—oxide layer, 2'—new oxide layer;
G10—first trench initial structure, G11—first trench intermediate structure, G1—first trench, G2—second trench; and
3—first isolation structure, and 4—barrier layer.

DETAILED DESCRIPTION

For ease of understanding the present disclosure, the present disclosure will be described more fully hereinafter with reference to the accompanying drawings. Some embodiments of the present disclosure are provided in the accompanying drawings. The present disclosure may, however, be embodied in many different forms and should not be limited to the embodiments set forth herein. Rather, these embodiments are provided such that the present disclosure will be more thorough and complete.

Unless otherwise defined, all technical and scientific terms employed herein have the same meaning as commonly understood by one of ordinary skill in the art to which the present disclosure belongs. The terms employed in the specification of the present disclosure are merely for the purpose of describing some embodiments and are not intended for limiting the present disclosure.

It should be understood that when an element or layer is referred to as being "on", "adjacent to", "connected to" or "coupled to" other elements or layers, it may be directly on, adjacent to, connected or coupled to the other elements or layers, or intervening elements or layers may be present. In contrast, when an element is referred to as being "directly on", "directly adjacent to", "directly connected to" or "directly coupled to" other elements or layers, there are no intervening elements or layers present.

It should be understood that although the terms first, second, etc. may be employed to describe various elements, components, regions, layers, doping types and/or sections, these elements, components, regions, layers, doping types and/or sections should not be limited by these terms. These terms are only employed to distinguish one element, component, region, layer, doping type, or section from another element, component, region, layer, doping type, or section. Therefore, without departing from the teachings of the present disclosure, a first element, component, region, layer, doping type, or section discussed below may be represented as a second element, component, region, layer, doping type, or section.

Spatially relative terms such as "below", "under", "lower", "beneath", "above", "upper" and the like may be used herein to describe relationships between one element or feature as shown in the figures and another element(s) or feature(s). It should be understood that the spatially relative terms may be intended to encompass different orientations of a device in use or operation in addition to the orientation depicted in the figures. For example, if the device in the figures is turned over, elements or features described as "under", "beneath" or "below" other elements or features would then be oriented "above" the other elements or features. Thus, the example term "under", "below" or "beneath" may encompass both an orientation of above and below. In addition, the device may also be otherwise oriented (for example, rotated 90 degrees or at other orientations) and the spatially relative descriptors used herein should be interpreted accordingly.

As used herein, the singular forms of "a", "one" and "said/the" are also intended to include plural forms, unless the context clearly indicates otherwise. It should be also understood that the terms "comprise/include" or "having" and so on refer to the presence of stated features, integers, steps, operations, components, parts or combinations thereof, but do not preclude possibility of the presence or addition of one or more other features, integers, steps, operations, components, parts or combinations thereof. Meanwhile, the term "and/or" used in the specification includes any and all combinations of related listed items.

Embodiments of the present disclosure are described herein with reference to cross-sectional illustrations serving as schematic illustrations of idealized embodiments (and intermediate structures) of the present disclosure. As such, variations from the shapes of the illustrations as a result, for example, of manufacturing techniques and/or tolerances, may be expected. Thus, the embodiments of the present disclosure should not be construed as being limited to particular shapes of regions illustrated herein but may include deviations in shapes that result, for example, from the manufacturing techniques. Thus, regions illustrated in the figures are schematic in nature and their shapes neither illustrate an actual shape of a region of the device nor limit the scope of the present disclosure.

At present, with the development of semiconductor technologies, the feature sizes of the devices in the integrated circuits are getting smaller and smaller. Especially after a semiconductor process enters a deep sub-micron stage, vertical transistor arrays are arranged in the DRAM, and use of buried bit lines and buried word lines (that is, arranged inside a substrate) can simplify connection structures between transistor arrays and capacitors. For example, part of contact structures can be eliminated. However, the use of the buried bit lines is also prone to a large parasitic capacitance.

On this basis, embodiments of the present disclosure provide a semiconductor structure and a method for fabricating the same, which may precisely control trench widths of trenches in the semiconductor structure, to form isolation structures with precise dimensions in the trenches, thereby effectively reducing the parasitic capacitance, to improve the production yield and electrical properties of the semiconductor structure. But the present disclosure is not limited thereto, and the embodiments of the present disclosure may be applied to any trench structure that needs to improve dimensional precision.

Referring to FIG. 1, some embodiments of the present disclosure provide a method for fabricating the semiconductor structure. The method for fabricating the semiconductor structure includes following steps: S100, providing a substrate, where a plurality of first trench initial structures are formed on the substrate, and the plurality of first trench initial structures extend along a first direction; and S200, sequentially performing a thermal oxidation process and an oxide etching process on trench walls of the first trench initial structures to form first trenches whose trench widths satisfy a first preset dimension.

Figure 2:
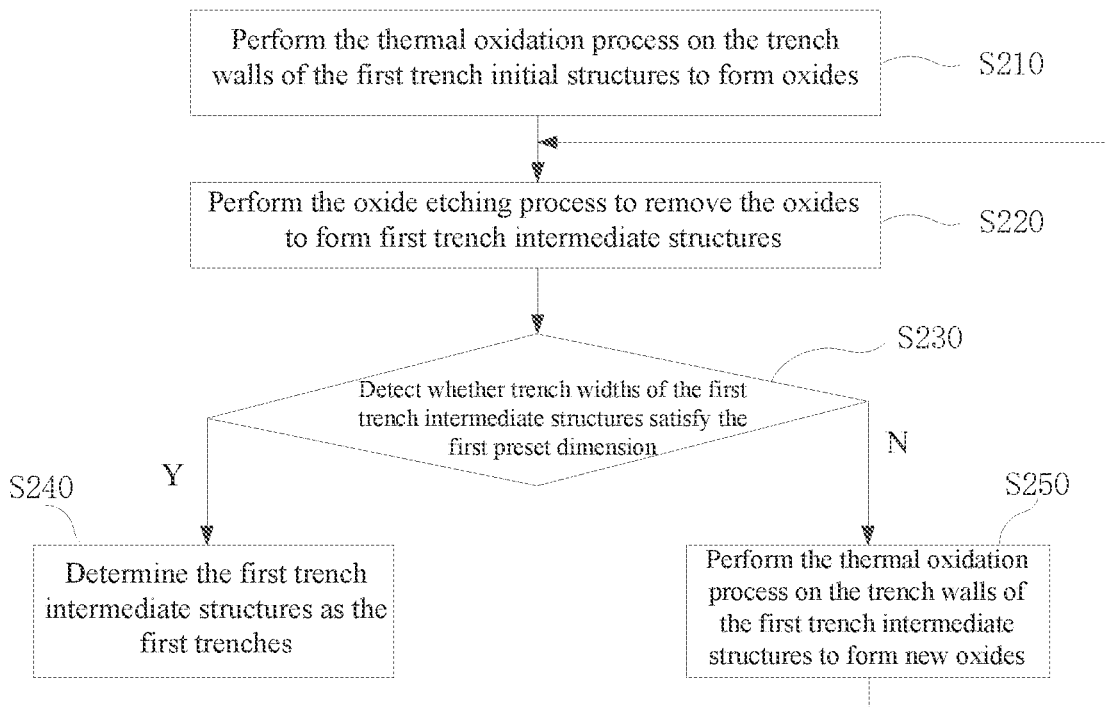
FIG. 2 is a flowchart of each step in Step S200 provided in an embodiment.

In some embodiments, referring to FIG. 2, in Step S200, the sequentially performing the thermal oxidation process and the oxide etching process on the trench walls of the first trench initial structures to form the first trenches whose trench widths satisfy the first preset dimension includes following steps: S210, performing the thermal oxidation process on the trench walls of the first trench initial structures to form oxides; S220, performing the oxide etching process to remove the oxides to form first trench intermediate structures; S230, detecting whether trench widths of the first trench intermediate structures satisfy the first preset dimension; S240, determining the first trench intermediate structures as the first trenches when a detection result is YES; and S250, performing the thermal oxidation process on the trench walls of the first trench intermediate structures to form new oxides, and returning to perform the oxide etching process to remove the oxides when the detection result is NO.

In the embodiments of the present disclosure, for the first trenches arranged in the semiconductor structure, first trench initial structures may be formed first, and then the thermal oxidation process and the oxide etching process may be sequentially performed on trench walls of the first trench initial structures, to precisely control the trench widths of the first trenches to a preset dimension, thereby forming the first trenches with higher dimensional accuracy. In this way, the first isolation structures with a precise dimension may be formed in the first trenches, and the first isolation structures are configured to effectively reduce the parasitic capacitance between the adjacent conductive structures, such that it is advantageous to improving the production yield and electrical properties of the semiconductor structure. In addition, the method adopted in the embodiments of the present disclosure is simple and easy for implementation, and also is advantageous to improving production efficiency.

In some embodiments, the first trenches are bit line isolation trenches, and the first isolation structures correspondingly formed in the first trenches are configured to isolate the adjacent bit lines, which may effectively reduce the parasitic capacitance between the adjacent bit lines.

In some embodiments, single formation thicknesses of the above oxides include: 0.5 nm to 1.5 nm, for example, 0.5 nm, 0.8 nm, 1.0 nm, 1.2 nm, or 1.5 nm.

In some embodiments, the above thermal oxidation process includes a rapid thermal oxidation (RTO) process.

In some embodiments, the above oxide etching process includes a quasi atomic layer etching (QALE) process.

Figure 3:
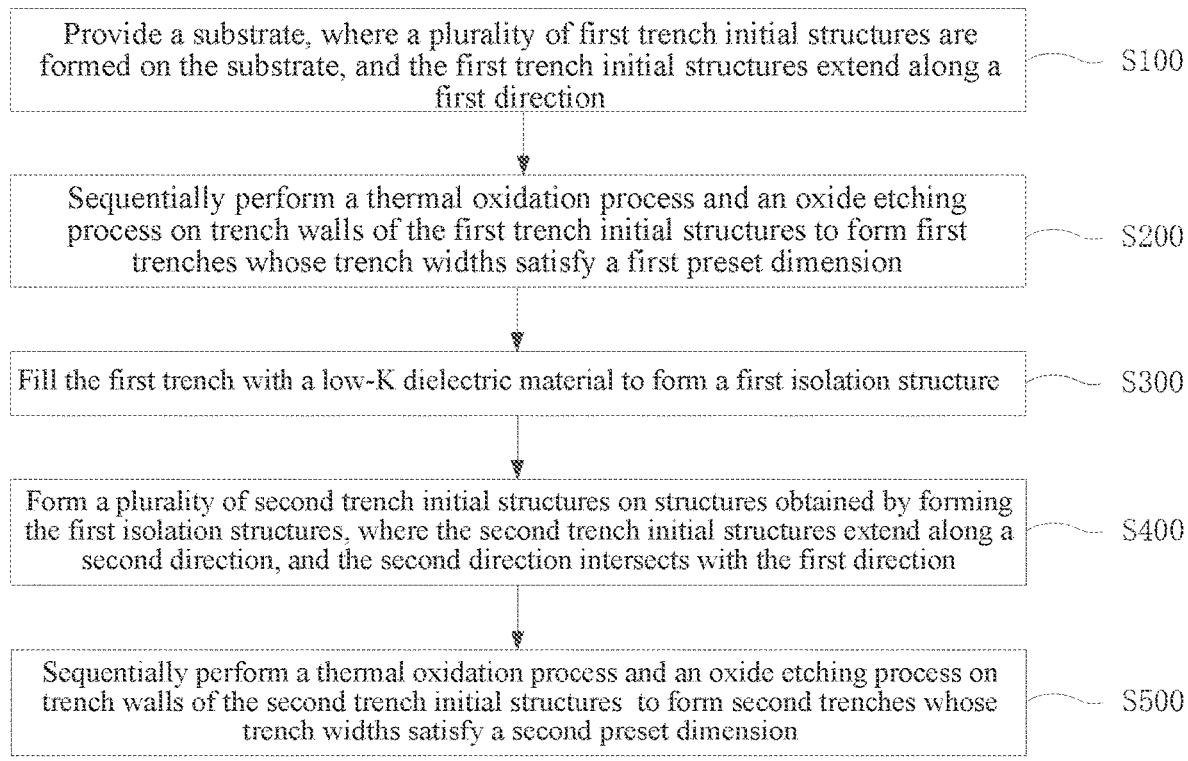
FIG. 3 is a flowchart of a method for fabricating the semiconductor structure provided in another embodiment.

Referring to FIG. 3, in some embodiments, the method further includes Step S300.

S300, filling the first trench with a low-K dielectric material to form a first isolation structure. In this way, the first isolation structures formed of the low-K dielectric material may further reduce the parasitic capacitance formed between the conductive structures on two sides of the first isolation structure.

With continued reference to FIG. 3, in some embodiments, the method further includes following steps: S400, forming a plurality of second trench initial structures on structures obtained by forming the first isolation structures, where the second trench initial structures extend along a second direction, and the second direction intersects with the first direction; and S500, sequentially performing a thermal oxidation process and an oxide etching process on trench walls of the second trench initial structures to form second trenches whose trench widths satisfy a second preset dimension.

Figure 4:
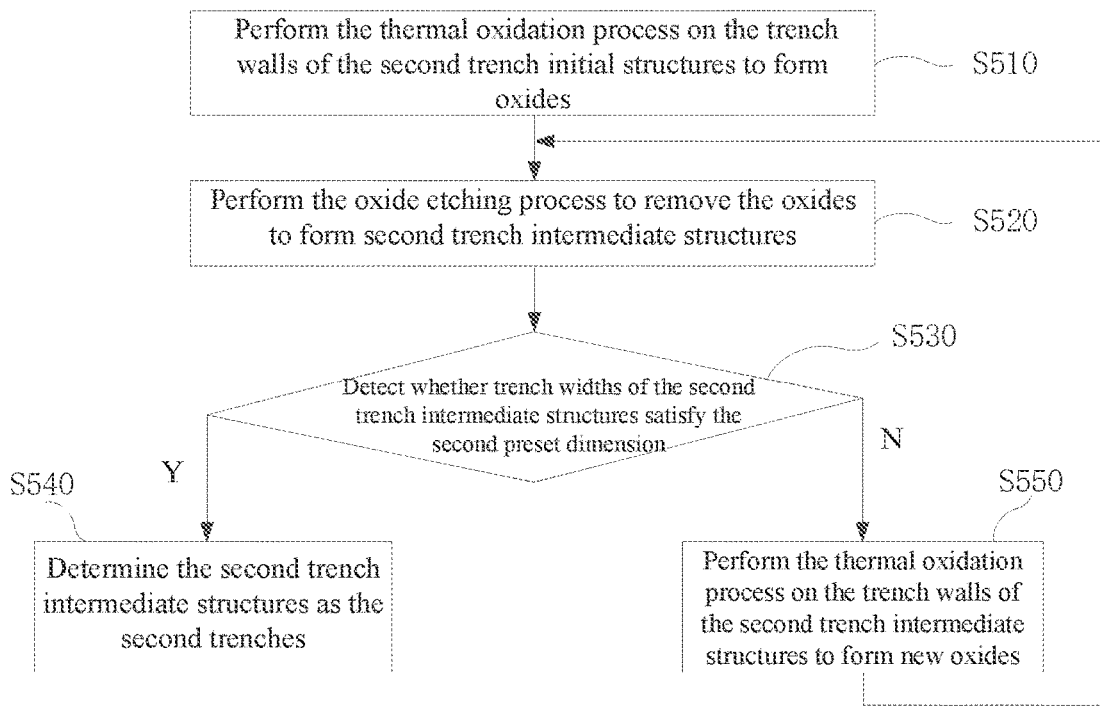
FIG. 4 is a flowchart of each step in Step S500 provided in an embodiment.

In some embodiments, referring to FIG. 4, in Step S500, the sequentially performing the thermal oxidation process and the oxide etching process on the trench walls of the second trench initial structures to form the second trenches whose trench widths satisfy the second preset dimension includes following steps: S510, performing the thermal oxidation process on the trench walls of the second trench initial structures to form oxides; S520, performing the oxide etching process to remove the oxides to form second trench intermediate structures; S530, detecting whether trench widths of the second trench intermediate structures satisfy the second preset dimension; S540, determining the second trench intermediate structures as the second trenches when a detection result is YES; and S550, performing the thermal oxidation process on the trench walls of the second trench intermediate structures to form new oxides, and returning to Step S520 of performing the oxide etching process to remove the oxides when the detection result is NO.

In the embodiments of the present disclosure, for the second trenches arranged in the semiconductor structure, the same method as that for the first trenches may be adopted. For example, second trench initial structures may be formed first, and then the thermal oxidation process and the oxide etching process may be sequentially performed on trench walls of the second trench initial structures, to precisely control the trench widths of the second trenches to a preset dimension, thereby forming the second trenches with higher dimensional accuracy. In this way, second isolation structures with precise dimensions may be formed in the second trenches, and the second isolation structures are configured to effectively reduce the parasitic capacitance between the adjacent conductive structures, thereby further improving the production yield and the electrical properties of the semiconductor structure. In addition, the method adopted in the embodiments of the present disclosure is simple and easy for implementation, and also is advantageous to further improving the production efficiency.

In some embodiments, the second trenches are word line isolation trenches, and the second isolation structures correspondingly formed in the second trenches are configured to isolate the adjacent word lines, which may effectively reduce the parasitic capacitance between the adjacent word lines.

In some embodiments, single formation thicknesses of the above oxides include: 0.5 nm to 1.5 nm, for example, 0.5 nm, 0.8 nm, 1.0 nm, 1.2 nm, or 1.5 nm.

In some embodiments, the above thermal oxidation process includes a rapid thermal oxidation process.

In some embodiments, the above oxide etching process includes a quasi atomic layer etching process.

It is to be understood that the first direction intersects with, e.g., is perpendicular to, the second direction. In some embodiments, the plurality of first trenches and the plurality of second trenches may isolate a plurality of active areas in the substrate. The method further includes: forming buried bit lines extending along the first direction at lower portions of the active areas, where adjacent buried bit lines are isolated by means of the first isolation structures.

Herein, the buried bit lines may be formed after the formation of the second trenches and before the formation of the second isolation structures, and other formation sequences may also be adopted. For example, the buried bit lines may be formed before the formation of the second trenches. The embodiments of the present disclosure do not limit this, and settings may be selected according to actual requirements.

It is to be understood that the semiconductor structure generally includes a cell array region and a peripheral circuit region positioned on at least one side of the cell array region.

In some embodiments, the plurality of first trenches and the plurality of second trenches are respectively positioned in the cell array area, the plurality of first trenches are arranged at equal intervals in parallel with one another along the second direction, and the plurality of second trenches are arranged at equal intervals in parallel with one another along the first direction.

In some embodiments, pitches from lower surfaces of the buried bit lines to an upper surface of the substrate are smaller than trench depths of the first trenches. In this way, it may be ensured that the first isolation structures formed in the first trenches can effectively isolate the adjacent bit lines.

In some embodiments, the trench depths of the second trenches are smaller than the trench depths of the first trenches. The buried bit lines are positioned below the second trenches and are spaced from the second trenches in a direction perpendicular to the substrate. That is, in an example where the first trenches are the bit line isolation trenches and the second trenches are the word line isolation trenches, considering the insulating effect of the bit lines and the word lines in a direction perpendicular to the substrate, the insulating effect may be achieved by controlling the trench depths of the first trenches and the trench depths of the second trenches.

In some embodiments, the method further includes: filling the second trenches with a low-K dielectric material to form second isolation structures. In this way, the second isolation structures formed of the low-K dielectric material may be employed to further reduce the parasitic capacitance between the conductive structures on two sides of the second isolation structures.

In some embodiments, the method further includes: forming buried word lines extending along the second direction on side walls of the active areas, where adjacent buried word lines are isolated by means of the second isolation structures.

Herein, the buried word lines may be formed after the formation of the second trenches and before the formation of the second isolation structures, and other formation sequences may also be adopted. For example, the buried bit lines may be formed after the formation of the second isolation structures. The embodiments of the present disclosure do not limit this, and settings may be selected according to actual requirements.

Based on the same inventive concept, some embodiments of the present disclosure provide a semiconductor structure, which may be obtained by means of the method for fabricating the semiconductor structure as described in some of the above embodiments. The semiconductor structure is, for example, a DRAM device, or any semiconductor structure having at least one trench to form isolation structures with precise dimension control. The embodiments of the present disclosure are not limited thereto.

To more clearly illustrate the semiconductor structure and the method for fabricating the same provided by the embodiments of the present disclosure, the semiconductor structure and the method for fabricating the same provided by the embodiments of the present disclosure are described in detail below with reference to FIG. 5 to FIG. 12.

Figure 5:
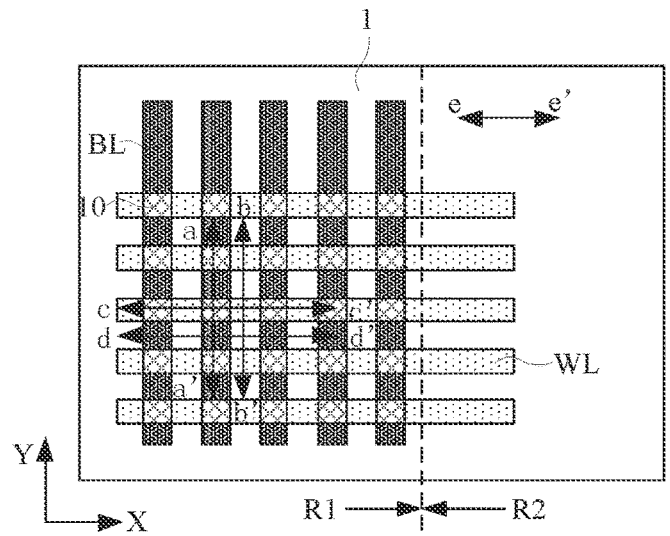
FIG. 5 is a schematic top view of a semiconductor structure provided in an embodiment.

Referring to FIG. 5, the semiconductor structure includes: a plurality of bit lines BL arranged at intervals in parallel on the substrate 1, a plurality of word lines WL arranged at intervals in parallel, and active areas 10 positioned in an intersection region between the bit lines BL and the word lines WL. The bit lines BL extend along a first direction such as a Y direction, and the word lines WL extend along a second direction such as an X direction, where the first direction and the second direction are perpendicular to each other.

In addition, as shown in FIG. 5, the semiconductor structure includes a cell array region R1 and a peripheral circuit region R2 positioned on at least one side of the cell array region R1. The active areas 10 may be arranged in array in the cell array region R1 in the form of a columnar structure, arranged in columns along the first direction, and arranged in rows along the second direction. One bit line BL is correspondingly connected to the active areas 10 arranged in a column, and extends to the peripheral circuit region R2. One word line WL is correspondingly connected to the active areas 10 arranged in a row, and extends to the peripheral circuit region R2.

On this basis, Figures (A) in FIGS. 6 to 12 are schematic cross-sectional structure diagrams of the structure shown in FIG. 5 along an a-a' direction, Figures (B) in FIGS. 6 to 12 are schematic cross-sectional structure diagrams of the structure shown in FIG. 5 along a b-b' direction, Figures (C) in FIGS. 6 to 12 are schematic cross-sectional structure diagrams of the structure shown in FIG. 5 along a c-c' direction, Figures (D) in FIGS. 6 to 12 are schematic cross-sectional structure diagrams of the structure shown in FIG. 5 along a d-d' direction, and Figures (E) in FIGS. 6 to 12 are schematic cross-sectional structure diagrams of the structure shown in FIG. 5 along an e-e' direction.

Figure 6:
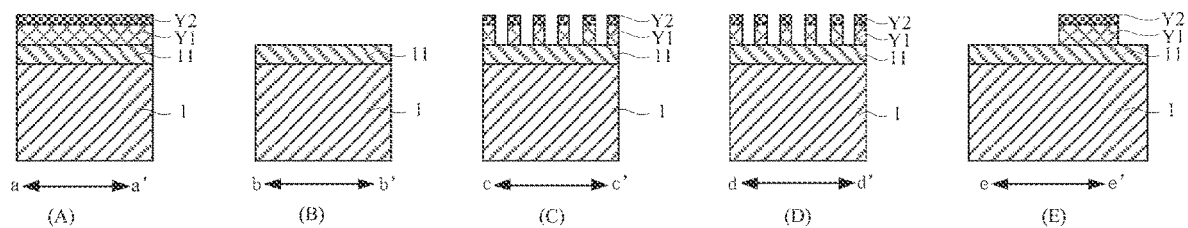
FIG. 6 is a schematic structural diagram of a structure obtained after forming a mask layer provided in an embodiment.
Figure 7:
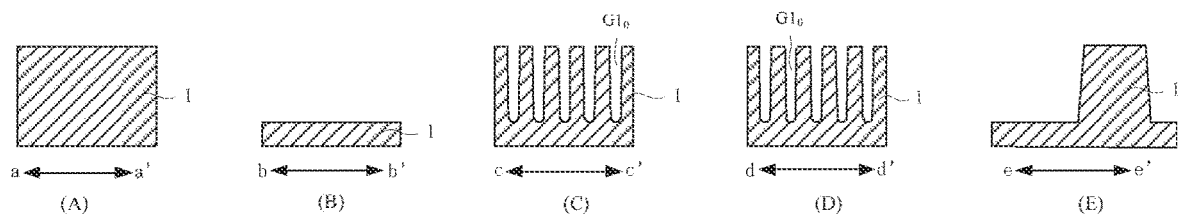
FIG. 7 is a schematic structural diagram of a structure obtained after forming a first trench initial structure provided in an embodiment.

In Step S100, referring to FIG. 6 and FIG. 7, a substrate 1 is provided, a plurality of first trench initial structures $G1_0$ are formed on the substrate 1, and the first trench initial structures $G1_0$ extend along the first direction.

For example, the substrate 1 may be formed of a semiconductor material, an insulating material, a conductor material, or any combination thereof. The substrate 1 may be a single-layer structure or a multi-layer structure. For example, the substrate 1 may be, for example, a silicon (Si) substrate, a silicon germanium (SiGe) substrate, a silicon germanium carbon (SiGeC) substrate, a silicon carbide (SiC) substrate, a gallium arsenide (GaAs) substrate, an indium arsenide (InAs) substrate, an indium phosphide (InP) substrate, or another III/V semiconductor substrate or II/VI semiconductor substrate. In some embodiments, for another example, the substrate 1 may be a layered substrate including, for example, Si/SiGe, Si/SiC, silicon-on-insulator (SOI), or silicon-germanium-on-insulator.

For example, the plurality of first trench initial structures $G1_0$ may be fabricated and formed by means of a self-aligned process, such as a self-aligned double patterning (SADP) technology or a self-aligned quadruple patterning (SAQP) technology, or its reverse (R) process.

In one example, as shown in FIG. 6, an etching protection layer 11, a hard mask layer Y1 and an anti-reflection layer Y2 are sequentially formed on the surface of the substrate 1. The hard mask layer Y1 and the anti-reflection layer Y2 are used as mask layers, which may be patterned based on a patterned photoresist layer to form mask patterns.

Herein, the etching protection layer 11 may be formed of an oxide material, such as silicon dioxide. The hard mask layer Y1 may be formed of a silicon nitride material, a pure carbon material, a polycrystalline silicon material layer, or a metal material. The anti-reflection layer Y2 may be a dielectric anti-reflection coating, for example, formed of silicon oxynitride or other nitrogen-containing compounds.

In addition, after the mask patterns are formed in the hard mask layer Y1 and the anti-reflection layer Y2, the substrate 1 may be etched based on the mask patterns to form the first trench initial structures $G1_0$ in the substrate 1, as shown, for example, FIG. 7.

Figure 8:
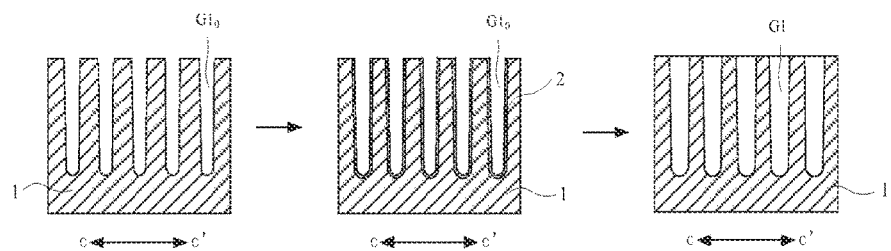
FIG. 8 is a flow chart showing fabrication of a first trench provided in an embodiment.
Figure 9:
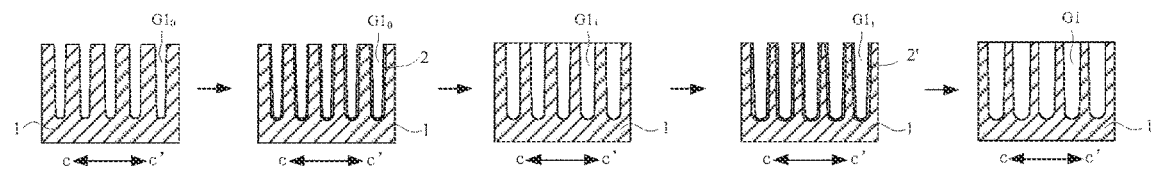
FIG. 9 is a flow chart showing fabrication of a first trench provided in another embodiment.

In Step S200, it is understood with reference to FIG. 8 and FIG. 9, the thermal oxidation process and the oxide etching process are sequentially performed on the trench walls of the first trench initial structures $G1_0$, to form the first trenches G1 whose trench widths satisfy a first preset dimension.

For example, in Step S210, the thermal oxidation process is performed on the trench walls of the first trench initial structures $G1_0$ to form oxides 2.

Herein, the thermal oxidation process is, for example, a rapid thermal oxidation process. Using the rapid thermal oxidation process may precisely control the formation thicknesses of the oxides 2.

In some embodiments, the formation thicknesses of the oxides 2 include: 0.5 nm to 1.5 nm. For example, the formation thicknesses may be: 0.5 nm, 0.8 nm, 1.0 nm, 1.2 nm, or 1.5 nm.

In one example, the formation thicknesses of the oxides 2 are 0.5 nm. In this way, by controlling the single formation thicknesses of the oxides 2, the single adjustment dimensions of the trench widths of the trenches may be controlled correspondingly, to ensure that the adjustment of the trench widths of the trenches can achieve higher precision.

In Step S220, the oxide etching process is performed to remove the oxides 2 to form first trench intermediate structures $G1_1$.

Herein, the oxide etching process, such as the quasi atomic layer etching process, can precisely etch down to one atomic layer (e.g., 0.4 nm), uniformly etch atomic layers one by one during the etching process, and stop at appropriate time or position, such that extremely high etching selectivity, precise etching control, and good uniformity can be achieved.

In Step S230, it is detected whether the trench widths of the first trench intermediate structures $G1_1$ satisfy the first preset dimension.

Herein, the first preset dimension may be selected and set according to actual needs.

It is to be understood that minimum trench width dimensions of the first trench initial structures $G1_0$ may depend on a minimum process dimension F. The minimum process dimension F refers to the minimum dimension that the process can reach, also known as critical dimension (CD), which may be used as a standard to define the level of manufacturing technologies. By using the above method in the embodiments of the present disclosure, on the basis of the minimum process dimension F, the trench widths of the trenches may be increased to further reduce the critical dimensions of corresponding features.

Moreover, in an example where the first trenches G1 are the bit line isolation trenches, the parasitic capacitance between the adjacent bit lines is negatively correlated with the pitch between the adjacent bit lines and may be calculated and determined according to a formula. Therefore, the first preset dimension that meets the requirements may be accurately determined by means of calculation, and the trench widths of the first trenches G1 may be precisely controlled according to the first preset dimension.

In Step S240, when the trench widths of the first trench intermediate structures $G1_1$ satisfy the first preset dimension, the first trench intermediate structures $G1_1$ are determined as the first trenches G1.

In Step S250, when the trench widths of the first trench intermediate structures $G1_1$ do not satisfy the first preset dimension, the thermal oxidation process is performed on the trench walls of the first trench intermediate structures $G1_1$ to form new oxides 2', it is returned to Step S220 of performing the oxide etching process to remove the oxides and the subsequent steps are repeated until it is determined that the first trenches G1 whose trench widths satisfy the first preset dimension are formed.

From the above, in the embodiments of the present disclosure, the trench widths of the first trench initial structures $G1_0$ may be controlled by means of one or more times of trench wall oxidation and oxide etching removal, to obtain the first trenches G1 whose trench widths meet the requirements.

In some examples, as shown in FIG. 8, after the trench walls of the first trench initial structures $G1_0$ are oxidized once to form the oxides 2 and the oxides 2 are removed, the trench widths of the first trench intermediate structures obtained already meet the first preset dimension, and it is deemed that the fabrication of the first trenches G1 is completed.

In some other examples, as shown in FIG. 9, after the trench walls of the first trench initial structures $G1_0$ are oxidized once to form the oxides 2 and the oxides 2 are removed, the trench widths of the first trench intermediate structures $G1_1$ obtained do not meet the first preset dimension. In this case, the trench walls of the first trench intermediate structures $G1_1$ may be oxidized for the second time, and the oxides 2' may be removed after the new oxides 2' are formed. At this moment, if the trench widths of the first trench intermediate structures $G1_1$ obtained meet the first preset dimension, it is deemed that the fabrication of the first trenches G1 is completed. Otherwise, more times of oxidation and oxide etching removal need to be continued to finally obtain the first trenches G1.

Figure 10:
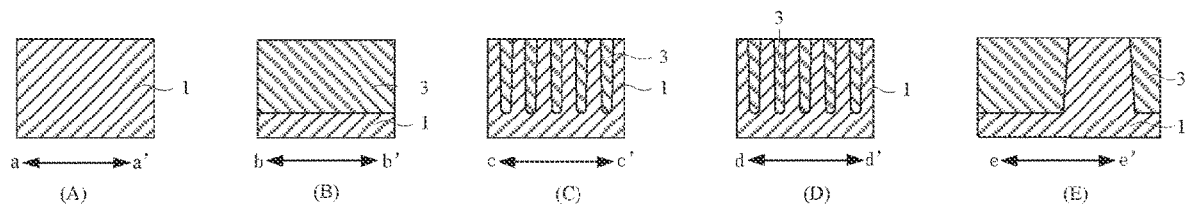
FIG. 10 is a schematic structural diagram of a structure obtained after forming a first isolation structure provided in an embodiment.

In Step S300, referring to FIG. 10, the first trenches G1 are filled with a low-K dielectric material to form first isolation structures 3. In this way, the first isolation structures 3 formed of the low-K dielectric material may further reduce the parasitic capacitance subsequently formed between the conductive structures on both sides thereof.

In some embodiments, the first trenches G1 are the bit line isolation trenches, and the first isolation structures 3 correspondingly formed in the first trenches G1 can be configured to isolate the adjacent bit lines, to effectively reduce the parasitic capacitance between the adjacent bit lines.

Figure 11:
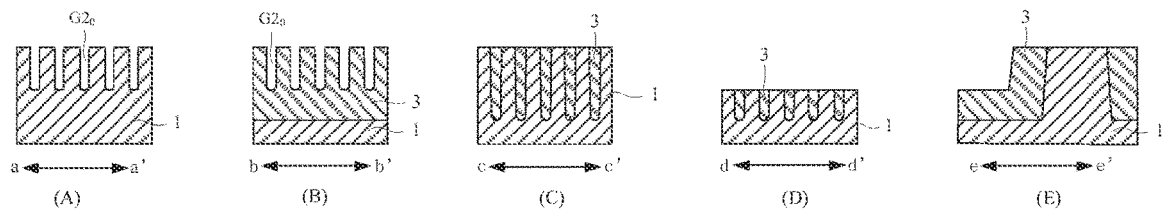
FIG. 11 is a schematic structural diagram of a structure obtained after forming a second trench initial structure provided in an embodiment.

In Step S400, it is to be understood with reference to FIG. 10 and FIG. 11, a plurality of second trench initial structures $G2_0$ are formed on structures obtained by forming the first isolation structures 3, where the second trench initial structures $G2_0$ extend along the second direction. The second direction intersects with the first direction. For example, the second direction is perpendicular to the first direction.

For example, the trench depths of the second trench initial structures $G2_0$ are smaller than those of the first trenches G1. The second trench initial structures $G2_0$ are formed in the substrate 1 and the first isolation structures 3.

Figure 12:
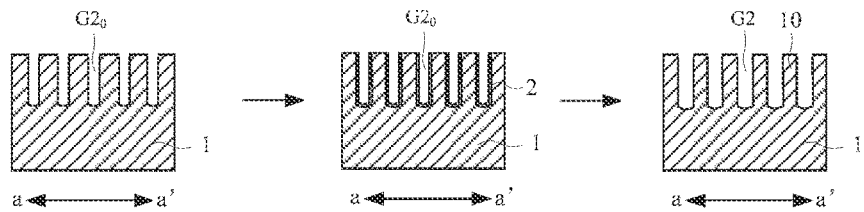
FIG. 12 is a flow chart showing fabrication of a second trench provided in an embodiment.

In Step S500, it is to be understood with reference to FIG. 11 and FIG. 12, the thermal oxidation process and the oxide etching process are sequentially performed on the trench walls of the second trench initial structures $G2_0$, to form the second trenches whose trench widths satisfy a second preset dimension.

Herein, after the first trenches G2 are formed, the plurality of first trenches G1 and the plurality of second trenches G2 may isolate the plurality of active areas 10 within the substrate 1.

In some embodiments, the plurality of first trenches G1 and the plurality of second trenches G2 are respectively positioned in the cell array region R1, the plurality of first trenches G1 are arranged at equal intervals in parallel with one another along the second direction, and the plurality of second trenches G2 are arranged at equal intervals in parallel with one another along the first direction.

In addition, the second trenches G2 may adopt the same method as that for the first trenches G1.

For example, in Step S510, the thermal oxidation process is performed on the trench walls of the second trench initial structures $G2_0$ to form the oxides 2.

Herein, the thermal oxidation process is, for example, a rapid thermal oxidation process. Using the rapid thermal oxidation process may precisely control the formation thicknesses of the oxides 2.

In some embodiments, the formation thicknesses of the oxides 2 include: 0.5 nm to 1.5 nm. For example, the formation thicknesses may be: 0.5 nm, 0.8 nm, 1.0 nm, 1.2 nm, or 1.5 nm.

In one example, the formation thicknesses of the oxides 2 are 0.5 nm. In this way, by controlling the single formation thicknesses of the oxides 2, the single adjustment dimensions of the trench widths of the trenches may be controlled correspondingly, to ensure that the adjustment of the trench widths of the trenches can achieve higher precision.

In Step S520, the oxide etching process is performed to remove the oxides 2 to form second trench intermediate structures.

Herein, the oxide etching process, such as the quasi atomic layer etching process, can precisely etch down to one atomic layer (e.g., 0.4 nm), uniformly etch atomic layers one by one during the etching process, and stop at appropriate time or position, such that extremely high etching selectivity, precise etching control, and good uniformity can be achieved.

In Step S530, it is detected whether the trench widths of the second trench intermediate structures satisfy the second preset dimension.

Herein, the second preset dimension may be selected and set according to actual needs.

It is to be understood that the minimum trench width dimensions of the second trench initial structures may depend on the minimum process dimension F. The minimum process dimension F refers to the minimum dimension that the process can process, also known as the critical dimension (CD), which may be used as a standard to define the level of the fabrication process. By using the above method in the embodiments of the present disclosure, on the basis of the minimum process dimension F, the trench widths of the trenches may be increased to further reduce the critical dimensions of corresponding features.

Moreover, in an example where the second trenches G2 are the word line isolation trenches, the parasitic capacitance between the adjacent word lines is negatively correlated with the pitch between the adjacent word lines and may be calculated and determined according to a formula. Therefore, the second preset dimension that meets the requirements may be accurately determined by means of calculation, and the trench widths of the second trenches G2 may be precisely controlled according to the second preset dimension.

In Step S540, when the trench widths of the second trench intermediate structures satisfy the second preset dimension, the second trench intermediate structures are determined as the second trenches G2.

In Step S550, when the trench widths of the second trench intermediate structures do not satisfy the second preset dimension, the thermal oxidation process is performed on the trench walls of the second trench intermediate structures to form new oxides, it is returned to Step S520 of performing the oxide etching process to remove the oxides and the subsequent steps are repeated until it is determined that the second trenches G2 whose trench widths satisfy the second preset dimension are formed.

From the above, in the embodiments of the present disclosure, the trench widths of the second trench initial structures $G2_0$ may be controlled by means of one or more times of trench wall oxidation and oxide etching removal, to obtain the second trenches G2 whose trench widths meet the requirements.

In some examples, as shown in FIG. 12, after the trench walls of the second trench initial structures $G2_0$ are oxidized once to form the oxides 2 and the oxides 2 are removed, the trench widths of the second trench intermediate structures obtained already meet the second preset dimension, and it is deemed that the fabrication of the second trenches G2 is completed.

In some other examples, after the trench walls of the second trench initial structures $G2_0$ are oxidized once to form the oxides 2 and the oxides 2 are removed, the trench widths of the second trench intermediate structures obtained do not meet the second preset dimension. In this case, the trench walls of the second trench intermediate structures may be oxidized for the second time, and the oxides may be removed after forming the new oxides. At this moment, when the trench widths of the second trench intermediate structures obtained meet the second preset dimension, it is deemed that the fabrication of the second trenches G2 is completed. Otherwise, more times of oxidation and oxide etching removal need to be continued to finally obtain the second trenches G2.

Figure 13:
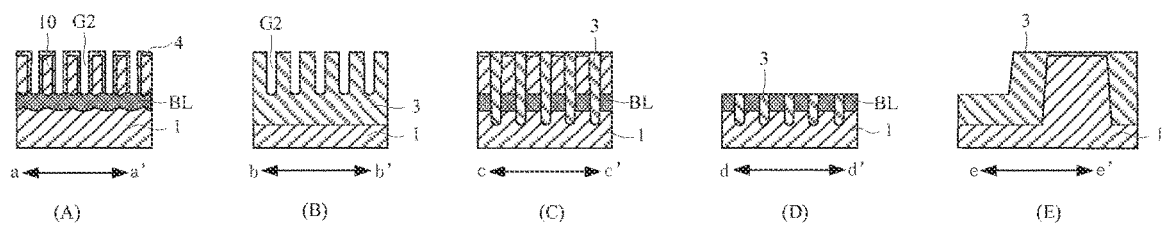
FIG. 13 is a schematic structural diagram of a structure obtained after forming a buried bit line provided in an embodiment.

In some embodiments, referring to FIG. 13, the method for fabricating the semiconductor structure further includes: forming the buried bit lines BL extending along the first direction at the lower portions of the active areas 10, where the adjacent buried bit lines BL are isolated by means of the first isolation structures 3.

In some embodiments, the buried bit lines BL may be formed after the formation of the second trenches G2 and before the formation of the second isolation structures, and other formation sequences may also be adopted. For example, the buried bit lines BL may be formed before the formation of the second trenches G2. The embodiments of the present disclosure do not limit this, and settings may be selected according to actual requirements.

In some examples, as shown in FIG. 13, barrier layers 4 covering exposed side walls of the active areas 10 are formed. Based on the implantation and diffusion of metal ions into the substrate 1 from the bottoms of the second trenches G2, the buried bit lines BL may be fabricated by forming metal silicides. In some embodiments, the substrate 1 may also be etched based on the bottoms of the second trenches G2 to form the bit line trenches, and then the buried bit lines BL are fabricated by depositing a metal material in the bit line trenches. The embodiments of the present disclosure do not limit fabrication methods of the buried bit lines BL.

For example, the pitches from the lower surfaces of the buried bit lines BL to the upper surface of the substrate 1 are smaller than the trench depths of the first trenches G1. In this way, it may be ensured that the first isolation structures 3 formed in the first trenches G1 can effectively isolate the adjacent bit lines BL.

In addition, in some embodiments, the second trenches G2 are word line isolation trenches.

In some embodiments, the trench depths of the second trenches G2 are smaller than the trench depths of the first trenches G1. The buried bit lines BL be positioned below the second trenches G2 and are spaced from the second trenches G2 in a direction perpendicular to the substrate 1. That is, in an example where the first trenches G1 are the bit line isolation trenches and the second trenches G2 are the word line isolation trenches, considering the insulating effect of the bit lines BL and the word lines WL in a direction perpendicular to the substrate 1, the insulating effect may be achieved by controlling the trench depths of the first trenches G1 and the trench depths of the second trenches G2.

In some embodiments, after forming the buried bit lines BL, the method further includes: filling the second trenches G2 with a low-K dielectric material to form second isolation structures. In this way, the second isolation structures formed of the low-K dielectric material may be employed to further reduce the parasitic capacitance between the conductive structures on two sides of the second isolation structures.

In the example where the second trenches G2 are the word line isolation trenches, the second isolation structures formed in the second trenches G2 may be configured to isolate adjacent word lines, to effectively reduce the parasitic capacitance between the adjacent word lines.

It should be noted that, in some embodiments, the method further includes: forming buried word lines WL extending along the second direction on side walls of the active areas 10, where adjacent buried word lines WL are isolated by means of the second isolation structures.

Herein, the buried word lines WL may be formed after the formation of the second trenches G2 and before the formation of the second isolation structures, and other formation sequences may also be adopted. For example, the buried word lines WL may be formed after the formation of the second isolation structures. The embodiments of the present disclosure are not limited thereto, and settings may be selected according to actual requirements.

In some embodiments, the buried word lines WL are formed of a metal or a metal compound such as titanium (Ti), titanium nitride (TiN), tungsten (W), cobalt (Co), copper (Cu) or aluminum (Al).

In addition, in combination with the settings of the semiconductor structure, in addition to the buried bit lines BL and the buried word lines WL mentioned in the above embodiments, there may also be steps of forming other thin films and other structures. Moreover, the embodiments of the present disclosure do not limit the formation order of each thin film and the formation order of each structure.

In the description of this specification, reference to the description of the terms "some embodiments", "other embodiments", "ideal embodiments", etc. means that a particular feature, structure, material or feature described in connection with the embodiments or examples is included in at least one embodiment or example of the present disclosure. The schematic representation of the above terms throughout this specification is not necessarily referring to the same embodiment or example.

Technical features of the above embodiments may be arbitrarily combined. For simplicity, all possible combinations of the technical features in the above embodiments are not described. However, as long as the combination of these technical features is not contradictory, it shall be deemed to be within the scope recorded in this specification.

The above embodiments merely express a plurality of implementations of the present disclosure, and descriptions thereof are relatively concrete and detailed. However, these embodiments are not thus construed as limiting the patent scope of the present disclosure. It is to be pointed out that for persons of ordinary skill in the art, some modifications and improvements may be made under the premise of not departing from a conception of the present disclosure, which shall be regarded as falling within the scope of protection of the present disclosure. Thus, the scope of protection of the present disclosure shall be subject to the appended claims.

What is claimed is:

1. A method for fabricating a semiconductor structure, comprising:
   providing a substrate, a plurality of first trench initial structures being formed on the substrate, and the plurality of first trench initial structures extending along a first direction; and
   sequentially performing a thermal oxidation process and an oxide etching process on trench walls of the plurality of first trench initial structures to form a plurality of first trenches whose trench widths satisfy a first preset dimension;
   filling the plurality of first trenches with a low-K dielectric material to form first isolation structures;
   forming a plurality of second trench initial structures on structures obtained by forming the first isolation structures, the plurality of second trench initial structures extending along a second direction, and the second direction intersecting with the first direction; and
   sequentially performing the thermal oxidation process and the oxide etching process on trench walls of the plurality of second trench initial structures to form a plurality of second trenches whose trench widths satisfy a second preset dimension.

2. The method for fabricating the semiconductor structure according to claim 1, wherein
   the sequentially performing the thermal oxidation process and the oxide etching process on the trench walls of the plurality of first trench initial structures to form the plurality of first trenches whose trench widths satisfy the first preset dimension comprises:
   performing the thermal oxidation process on the trench walls of the plurality of first trench initial structures to form oxides;
   performing the oxide etching process to remove the oxides to form first trench intermediate structures;
   detecting whether trench widths of the first trench intermediate structures satisfy the first preset dimension;
   determining the first trench intermediate structures as the plurality of first trenches when a detection result is YES; and
   performing the thermal oxidation process on the trench walls of the first trench intermediate structures to form new oxides, and returning to perform the oxide etching process to remove the oxides when the detection result is NO.

3. The method for fabricating the semiconductor structure according to claim 1, wherein
   the sequentially performing the thermal oxidation process and the oxide etching process on the trench walls of the plurality of second trench initial structures to form the plurality of second trenches whose trench widths satisfy the second preset dimension comprises:
   performing the thermal oxidation process on the trench walls of the plurality of second trench initial structures to form oxides;
   performing the oxide etching process to remove the oxides to form second trench intermediate structures;
   detecting whether trench widths of the second trench intermediate structures satisfy the second preset dimension;
   determining the second trench intermediate structures as the plurality of second trenches when a detection result is YES; and
   performing the thermal oxidation process on the trench walls of the second trench intermediate structures to form new oxides, and returning to perform the oxide etching process to remove the oxides when the detection result is NO.

4. The method for fabricating the semiconductor structure according to claim 2, wherein
   single formation thicknesses of the oxides comprise: 0.5 nm to 1.5 nm.

5. The method for fabricating the semiconductor structure according to claim 2, wherein
   the thermal oxidation process comprises a rapid thermal oxidation process.

6. The method for fabricating the semiconductor structure according to claim 2, wherein
   the oxide etching process comprises a quasi atomic layer etching process, the quasi atomic layer etching process can precisely etch down to one atomic layer, uniformly etch atomic layers one by one during the etching process, and stop at appropriate time or position.

7. The method for fabricating the semiconductor structure according to claim 1, wherein the plurality of first trenches and the plurality of second trenches isolate a plurality of active areas in the substrate;

and the method further comprises:

forming buried bit lines extending along the first direction at lower portions of the plurality of active areas, adjacent two of the buried bit lines being isolated by means of the first isolation structures.

8. The method for fabricating the semiconductor structure according to claim 7, wherein the plurality of first trenches are arranged at equal intervals in parallel with one another along the second direction; and the plurality of second trenches are arranged at equal intervals in parallel with one another along the first direction.

9. The method for fabricating the semiconductor structure according to claim 7, wherein pitches from lower surfaces of the buried bit lines to an upper surface of the substrate are smaller than trench depths of the plurality of first trenches.

10. The method for fabricating the semiconductor structure according to claim 9, wherein trench depths of the plurality of second trenches are smaller than the trench depths of the plurality of first trenches; and the buried bit lines are positioned below the plurality of second trenches and are spaced apart from the plurality of second trenches in a direction perpendicular to the substrate.

11. The method for fabricating the semiconductor structure according to claim 7, further comprising:

filling the plurality of second trenches with a low-K dielectric material to form second isolation structures.

12. The method for fabricating the semiconductor structure according to claim 11, further comprising:

forming buried word lines extending along the second direction on side walls of the plurality of active areas, adjacent two of the buried word lines being isolated by means of the second isolation structures.

* * * * *